United States Patent
Jun et al.

(10) Patent No.: US 9,866,235 B2
(45) Date of Patent: Jan. 9, 2018

(54) DIGITAL TO ANALOG CONVERTER

(71) Applicants: TEXAS INSTRUMENTS INCORPORATED, Dallas, TX (US); Zhang Jun, Shanghai (CN); Zhang Zefei, Zhejiang (CN); Su Anzhe, Shanghai (CN); Hao Meng, Shanghai (CN); Xianguang Wen, Shanghai (CN); Xuan Wang, Shanghai (CN)

(72) Inventors: Zhang Jun, Shanghai (CN); Zhang ZeFei, Shanghai (CN); Su Anzhe, Shanghai (CN); Hao Meng, Shanghai (CN); Xianguang Wen, Shanghai (CN); Xuan Wang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/482,734

(22) PCT Filed: May 6, 2014

(86) PCT No.: PCT/CN2014/076838
§ 371 (c)(1),
(2) Date: Sep. 10, 2014

(87) PCT Pub. No.: WO2015/168854
PCT Pub. Date: Nov. 12, 2015

(65) Prior Publication Data
US 2017/0194981 A1    Jul. 6, 2017

(51) Int. Cl.
*H03M 1/66*    (2006.01)
*H03M 1/68*    (2006.01)
*H03M 1/76*    (2006.01)

(52) U.S. Cl.
CPC .............. *H03M 1/68* (2013.01); *H03M 1/76* (2013.01)

(58) Field of Classification Search
CPC ............ H03M 1/68; H03M 1/76; H03M 1/66; H03M 1/747; H03M 1/00
USPC .................................. 341/144, 154, 145, 172
See application file for complete search history.

(56) References Cited

U.S. PATENT DOCUMENTS

| | | | | |
|---|---|---|---|---|
| 3,703,956 | A * | 11/1972 | Oswalt | B65D 79/00 184/1.5 |
| 5,646,619 | A * | 7/1997 | Daubert | H03M 1/1004 341/118 |
| 6,307,490 | B1 * | 10/2001 | Litfin | H03M 1/1033 341/121 |

(Continued)

FOREIGN PATENT DOCUMENTS

| | | |
|---|---|---|
| CH | 102377434 A | 6/2008 |
| CN | 101056106 A | 10/2007 |

(Continued)

*Primary Examiner* — Jean B Jeanglaude
(74) *Attorney, Agent, or Firm* — John R. Pessetto; Charles A. Brill; Frank D. Cimino

(57) ABSTRACT

Digital to analog converters have first and second to analog arrays. The first digital to analog array has a reference input, a reference output, a first digital input that is connectable to a digital signal, and an analog output. The second digital to analog array includes a reference input, a reference output that is coupled to the reference input of the first digital to analog array, a plurality of switches coupled to the reference input, and a plurality of resistors coupled between the switches and the reference output.

20 Claims, 6 Drawing Sheets

(56) References Cited

U.S. PATENT DOCUMENTS

| | | | | |
|---|---|---|---|---|
| 6,738,006 B1* | 5/2004 | Mercer | ............... | H03M 1/0604 |
| | | | | 341/144 |
| 7,348,912 B2* | 3/2008 | Confalonieri | ........... | H03M 1/68 |
| | | | | 341/144 |
| 8,823,569 B2* | 9/2014 | Jenkins | ................. | H03M 3/502 |
| | | | | 341/144 |
| 2010/0079318 A1* | 4/2010 | Berens | ................. | H03M 1/002 |
| | | | | 341/120 |
| 2012/0050084 A1* | 3/2012 | McLachlan | ......... | H03M 1/0845 |
| | | | | 341/154 |

FOREIGN PATENT DOCUMENTS

| CN | 101207385 A | 6/2008 |
|---|---|---|
| CN | 102118172 A | 7/2011 |

\* cited by examiner

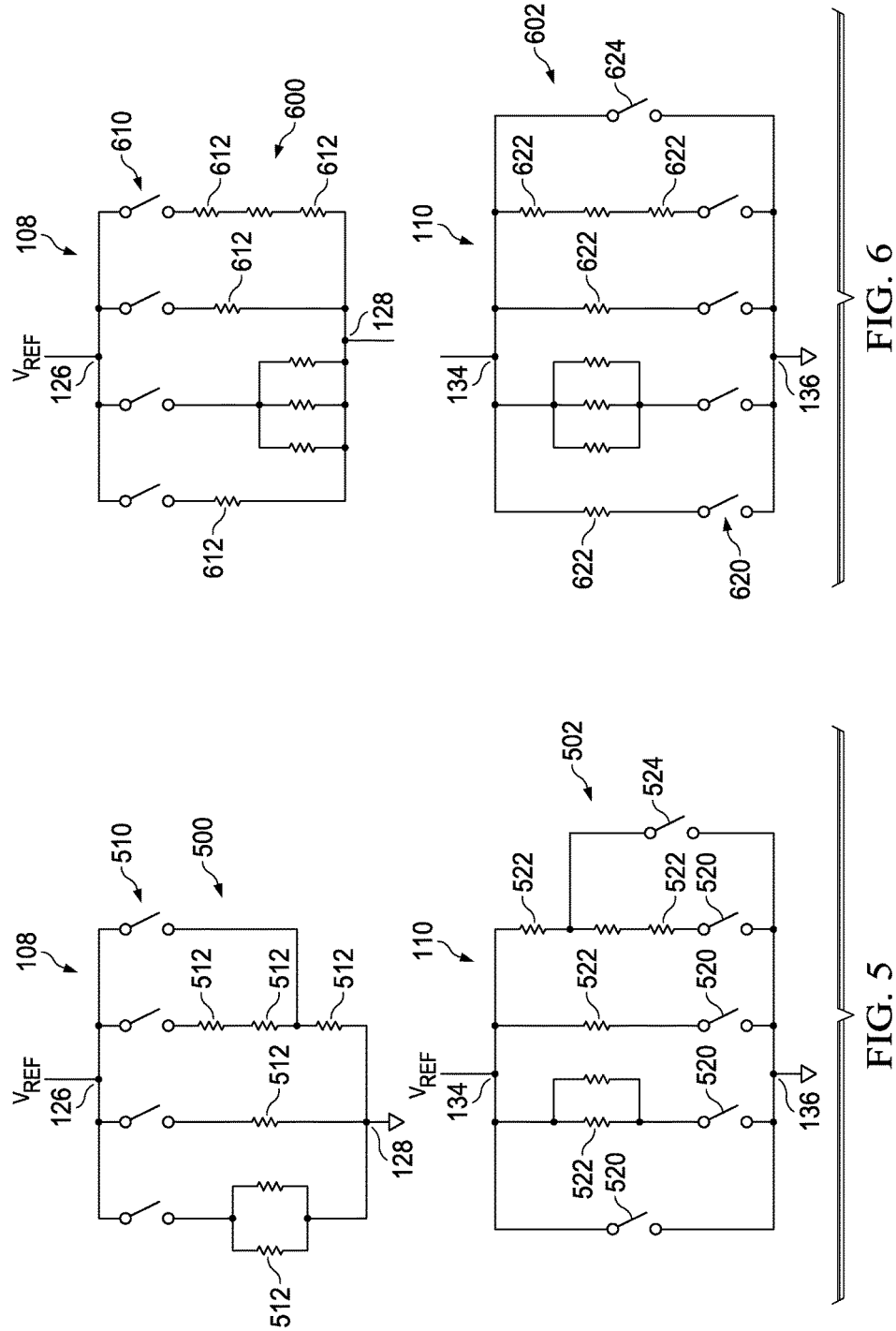

DIGITAL TO ANALOG CONVERTER

BACKGROUND

Digital to analog converters (DACs) convert digital signals or numbers to analog voltages. In some embodiments, a digital processor outputs a stream of numbers, such as binary numbers to a DAC. The DAC converts the numbers to an analog signal. For example, in digital audio, audio signals are processed using digital electronics, however, the digital signals need to be converted to analog signals in order to be heard by a user.

Because the input signal to a DAC is a digital signal having discrete values, the analog signal output by the DAC has a discrete number of voltage levels. For example, a four bit DAC may be able to receive inputs of sixteen different values, which corresponds to sixteen discrete voltage levels output by the DAC. Some DACs fine tune the output voltage by adjusting bias voltages to the DAC. These fine tuning mechanisms require the use of many resistors and switches and, as a consequence, use a large area on the DAC. They also subject the DAC to slower speeds due to the parasitic capacitance associated with the resistors.

SUMMARY

Digital to analog converters have first and second to analog arrays. The first digital to analog array has a reference input, a reference output, a first digital input that is connectable to a digital signal, and an analog output. The second digital to analog array includes a reference input, a reference output that is coupled to the reference input of the first digital to analog array, a plurality of switches coupled to the reference input, and a plurality of resistors coupled between the switches and the reference output.

BRIEF DESCRIPTION OF THE DRAWINGS

FIG. 5 is a schematic diagram of another embodiment of the second DAC array and the third DAC array of FIG. 1 having two bit resolution.

FIG. 6 is a schematic diagram of another embodiment of the second DAC array and the third DAC array of FIG. 1 having two bit resolution.

DETAILED DESCRIPTION

Figure 1:
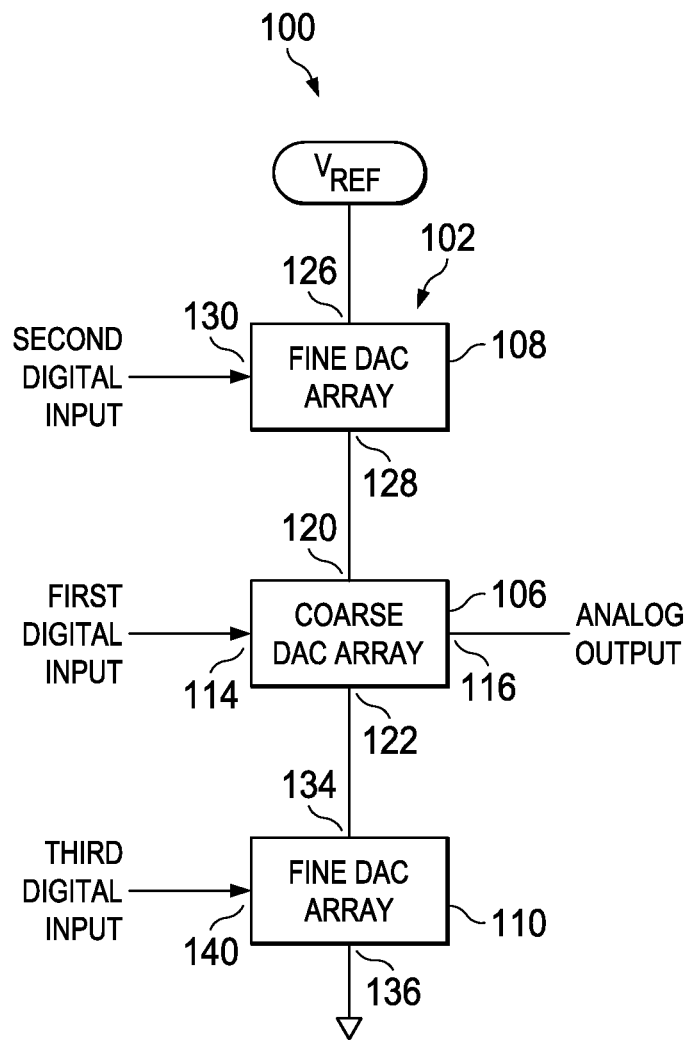
FIG. 1 is a block diagram of an embodiment of a digital to analog converter.

Digital to analog converters (DACs) that use less area than conventional DACs are described herein. DACs convert digital signals or numbers to analog voltages. For example, a binary number is input to a DAC. The DAC decodes the binary number and outputs a voltage representative of the binary number. Some DACs have modules that enable the DAC to fine tune the analog output. Reference is made to FIG. 1, which is a block diagram of an embodiment of a DAC 100 that has a plurality of arrays 102. The arrays 102 are referred to individually as the first DAC array 106, the second DAC array 108 and the third DAC array 110. The second DAC array 108 is sometimes referred to as the top array 108 and the third DAC array 110 is sometimes referred to as the bottom array 110. In some embodiments, the first DAC array 106 is referred to as a coarse DAC array and the second and third DAC arrays 108, 110 are referred to as fine arrays.

The first DAC array 106 has a digital input 114 that is sometimes referred to as the first digital input 114. The digital input 114 is coupled to or is able to be coupled to the digital signal that is to be converted to an analog signal, which is output on an output 116. The first DAC array 106 has a reference input 120 and a reference output 122, which are sometimes referred to as the first reference input 120 and the first reference output 122, respectively. As described in greater detail below, the first reference input 120 and the first reference output 122 fine tune the analog voltage value output by the first DAC array 106. The fine tuning is achieved by biasing the first DAC array 106 with an offset voltage as described below.

The second DAC array 108 has a voltage reference input 126 and a voltage reference output 128, which are sometimes referred to as the second voltage reference input 126 and the second voltage reference output 128, respectively. In the embodiment of FIG. 1, the second voltage reference input 126 is connected to a voltage reference Vref, which is a DC voltage. The second reference output 128 is connected to the reference input 120 of the first DAC array 106. The second DAC array 108 also has a digital input 130 that is sometimes referred to as the second digital input 130. The second digital input 130 is able to be coupled to or is coupled to a digital signal as described in greater detail below. In summary, the digital signal input by the second digital input 130 is the least significant bit or bits, or a lower significant bit of the digital signal on the first digital input 114. The second digital input 130 is used by the second DAC array 108 to generate the offset voltage at the reference input 120 and is used to fine tune the value of the analog output.

The third DAC array 110 has a reference input 134 and a reference output 136, which are sometimes referred to as the third reference input 134 and the third reference output 136, respectively. The reference input 134 is connected to the reference output 122 of the first DAC array 106. The reference output 136 is coupled to or is able to be coupled to a second reference voltage, which in the embodiment of FIG. 1 is ground as referenced to the voltage reference Vref. The third DAC array 110 has a digital input 140 that is sometimes referred to as the third digital input 140. The third digital input 140 is coupled to or is able to be coupled to a digital signal as described in greater detail below. In summary, the third DAC array 110 works with the second DAC array 108 to fine tune the value of the analog signal output by the first DAC array 106. As with the second DAC array 108, the digital signal input by the third digital input 140 is the least significant bit or bits, or a lower significant bit of the digital signal on the first digital input 114.

Figure 2:
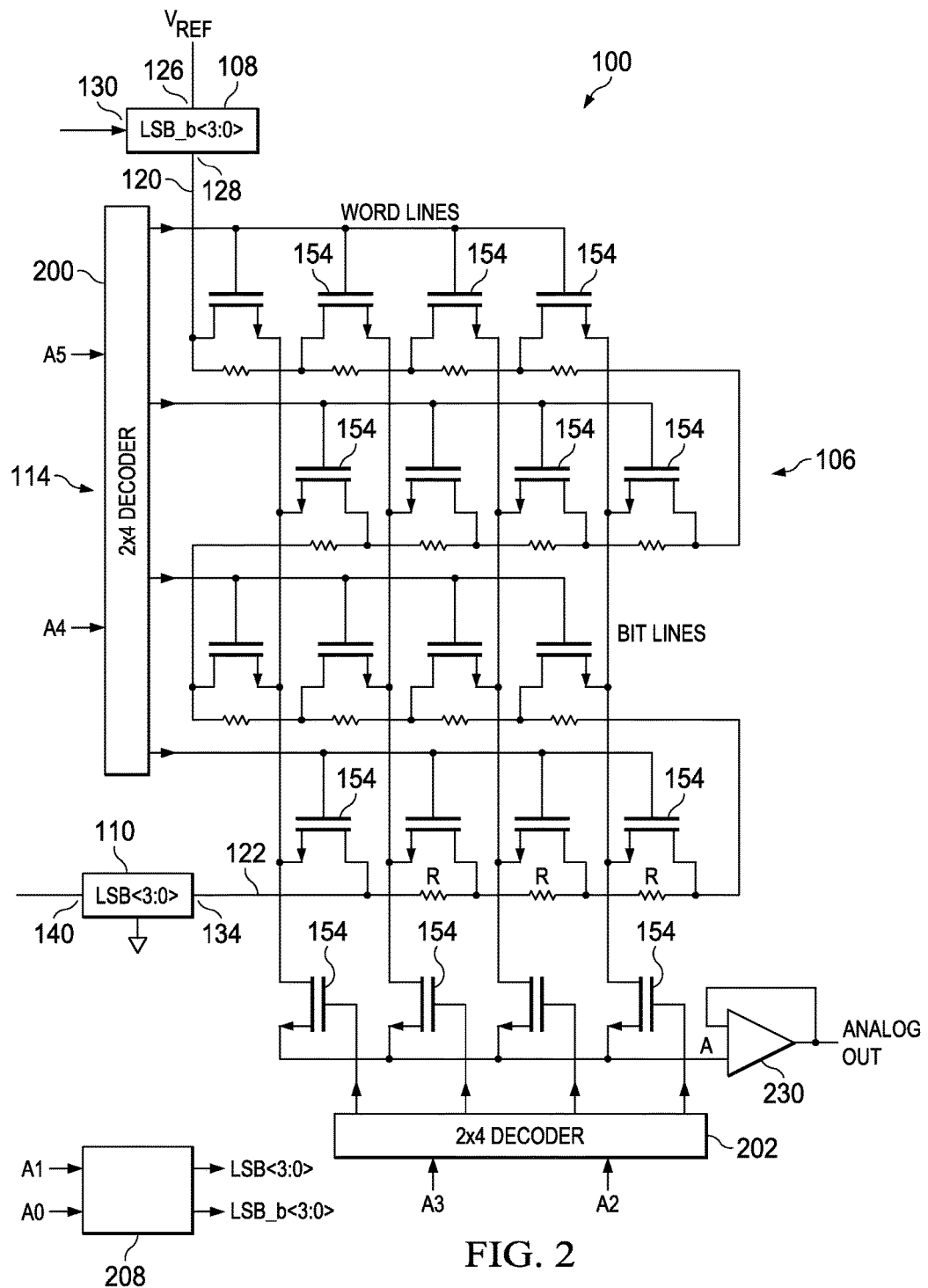
FIG. 2 is a schematic diagram of an embodiment of the first DAC array of FIG. 1.

Reference is made to FIG. 2, which is a schematic diagram of an embodiment of the DAC 100 of FIG. 1. In the schematic diagram of FIG. 2, the first DAC array 106 is shown as a conventional digital to analog converter and the second DAC array 108 and the third DAC array 110 are shown as blocks. The digital signal is input in parts as designated by the input signals of A0-A5. The higher bits A2-A5 are input to decoders 200 and 202 that decode the bits in the digital signal to operate a plurality of switches 154, which in the embodiment of FIG. 2 are field-effect transistors (FETs). In the embodiment of FIG. 2, the decoders 200 and 202 are 2×4 decoders. The least significant bits of the digital signal are input to a decoder 208, which in the embodiment of FIG. 1 is a 3×8 decoder. In other embodiments, other decoders may be used. For example, 2×4 decoders may be used. The decoder 208 decodes the least significant bits of the digital signal to operate the second DAC array 108 and the third DAC array 110. In the embodiments described in FIG. 2, the decoder 208 outputs three bits that can represent a total of eight different fine voltages generated by the second DAC array 108 and the third DAC array 110. In some embodiments, the DAC 100 has a buffer 230 that may provide interpolation.

Figure 3:
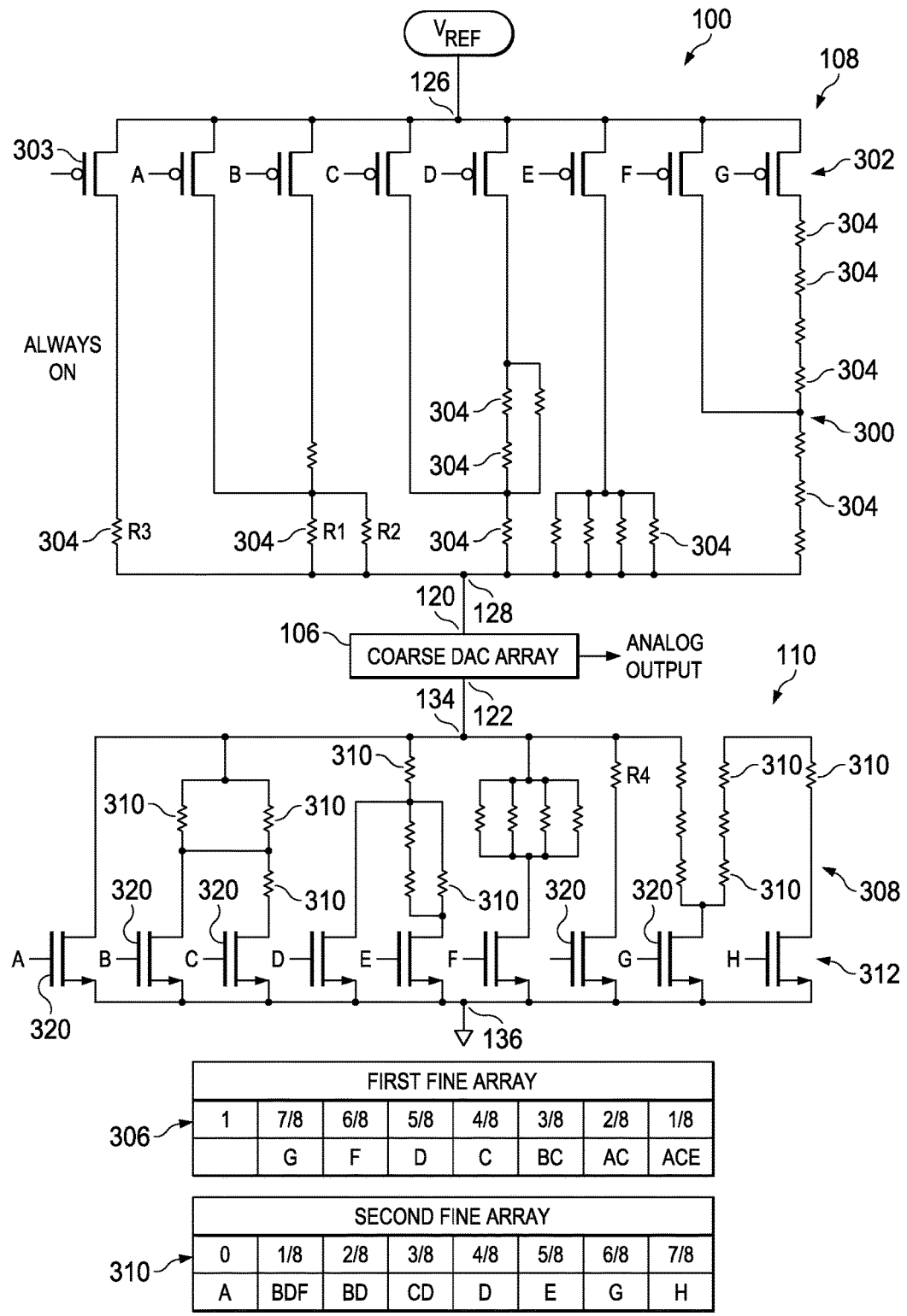
FIG. 3 is a schematic diagram of embodiments of the second DAC array and the third DAC array of FIG. 1 having three bit resolution.

FIG. 3 shows a schematic diagram of embodiments of the second DAC array 108 and the third DAC array 110 with a block representing the first DAC array 106. The second DAC array 108 and the third DAC array 110 include resistors in networks to provide discrete resistance values, wherein the resistor network of the second DAC array 108 is the inverse or mirror image of the resistor network in the third DAC array 110. Because the least significant bits used to control the second DAC array 108 and the third DAC array 110, there is a possibility of eight discrete resistance values for the fine tuning of the arrays 108 and 110 as will be evident by the following description. In other embodiments, different numbers of least significant bits may be used to generate a different number of possible discrete resistance values.

The second DAC array 108 includes a network 300. The network 300 includes eight switches 302 designated by the references A-G and a switch 303. The switches 302 connect resistors 304 to the reference input 126, which connects them to the reference voltage $V_{REF}$. In the embodiments described herein, the resistors 304 all have the same value, which is designated as R. The switch 303 is always on and may be substituted by a conductor, such as a wire or a trace so that the resistor R3 is connected between the reference input 126 and the reference output 128. The switches A-G set the resistance value between the reference input 126 and the reference output 128. As shown in FIG. 3, the resistance between the reference input 126 and the reference output 128, at least in part, controls the voltage to the reference input 120 of the first DAC array 106. The resistance values are in increments of one-eighth of R, which follows the three bits output by the decoder 208, FIG. 2.

The resistors are referenced by the switch to which they are associated. For example, the switch A is associated with resistors R1 and R2. Therefore, when the switch A is closed, the resistance between the input reference 126 and the output reference 128 is the parallel resistance of the resistors R1 through R3, wherein R3 is associated with the switch 303. The table 306 provides a chart as to the switch settings to achieve the incremental resistance values. By closing the switches indicated in the table 306, the incremental resistance values of one-eighth R are achieved.

The third DAC array 110 has a resistor and switch network 308 that is substantially similar to the resistor and switch network 300 of the second DAC array 108. The resistor and switch network 308 of the third DAC array 110 is sometimes referred to as being the inverse of or the mirror image of the resistor and switch network 300 of the second DAC array 108. As shown in FIG. 3, the third DAC array 110 has a plurality of resistors 310 and switches 312. The switches 312 are designated as switches A-H and a switch 320 that is always on. The switch 320 may be replaced by a conductor, such as a wire or a trace, rather than the FET shown in FIG. 3, so that the resistor R4 is always connected between the reference input 134 and the reference output 136.

The third DAC array 110 is configured so that the resistors 310 are connected or otherwise coupled to the reference input 134 and the switches 312 are connected or otherwise coupled to the reference output 136. The network 308 of resistors 310 and switches 312 is configured to be the inverse or mirror image network 300. The switching and resistance configuration of the network 308 provides for resistance values of zero to ⅞R as shown by the table 310. This configuration is slightly different than the configuration of the network 300 because the switch 320 of the network 308 is connected between the reference input 134 and the reference output 136 with no resistors connected in the line. Therefore, when the switch 320 is closed, the reference input 134 is shorted to the reference output 136 and there is no voltage drop between the reference input 134 and the reference output 136.

Having described the configuration of the second DAC array 108 and the third DAC array 110, their operation will now be described. As described above, the second and third DAC arrays 108 and 110 have variable resistance values and, therefore, are able to adjust the voltage drop between the reference input 120 and the reference output 122 on the first DAC array 106. By adjusting the voltage drop, the voltage at the analog output is able to be increased or decreased. In the embodiments described herein, the cumulative resistance between the second DAC array 108 and the third DAC array 110 is maintained at a value of R.

As an example of the operation of the DAC 100, the LSB indicates that the voltage of the analog output of the first array 106 needs to rise substantially or have a substantial positive offset. The decoder 208, FIG. 2, generates a digital signal to this effect that is output to both the second DAC array 108 and the third DAC array 110. The digital signal sent to the second DAC array 108 will lower its resistance. In the example described herein, the resistance of the second DAC array 108 needs to drop to (⅛)R, which is achieved by closing the switches A, C, and E as shown by the table 306. Likewise, the resistance of the third DAC array 110 will increase to its maximum amount of (⅞)R, which is achieved by closing switch H as shown by the table 310. Thus, the analog output voltage is shifted up, by ⅞ of one LSB voltage of the first array 106. The cumulative resistance between the first DAC array 108 and the second DAC array 110 remains at R. Therefore, the substantial offsets are achieved within one LSB voltage of the first array 106. As other offsets are required, other configurations of the switches 300 and 312 can be set.

In some embodiments, a positive or negative offset may be applied to the voltage of the analog output. In these embodiments, the DAC 100 is normally set with the resistance values of the second DAC array 108 and the third DAC array 110 at R/2 each. In the embodiment of FIG. 3, this normal condition is met by turning switch C in the second DAC array 108 on and the switch D in the third DAC array 110 on. If a positive offset is required, the resistance in the second DAC array 108 is decreased and the resistance in the third DAC array 110 is increased. On the other hand, if a negative offset is required, the resistance in the second DAC array 108 is increased and the resistance in the third DAC array 110 is decreased.

Figure 4:
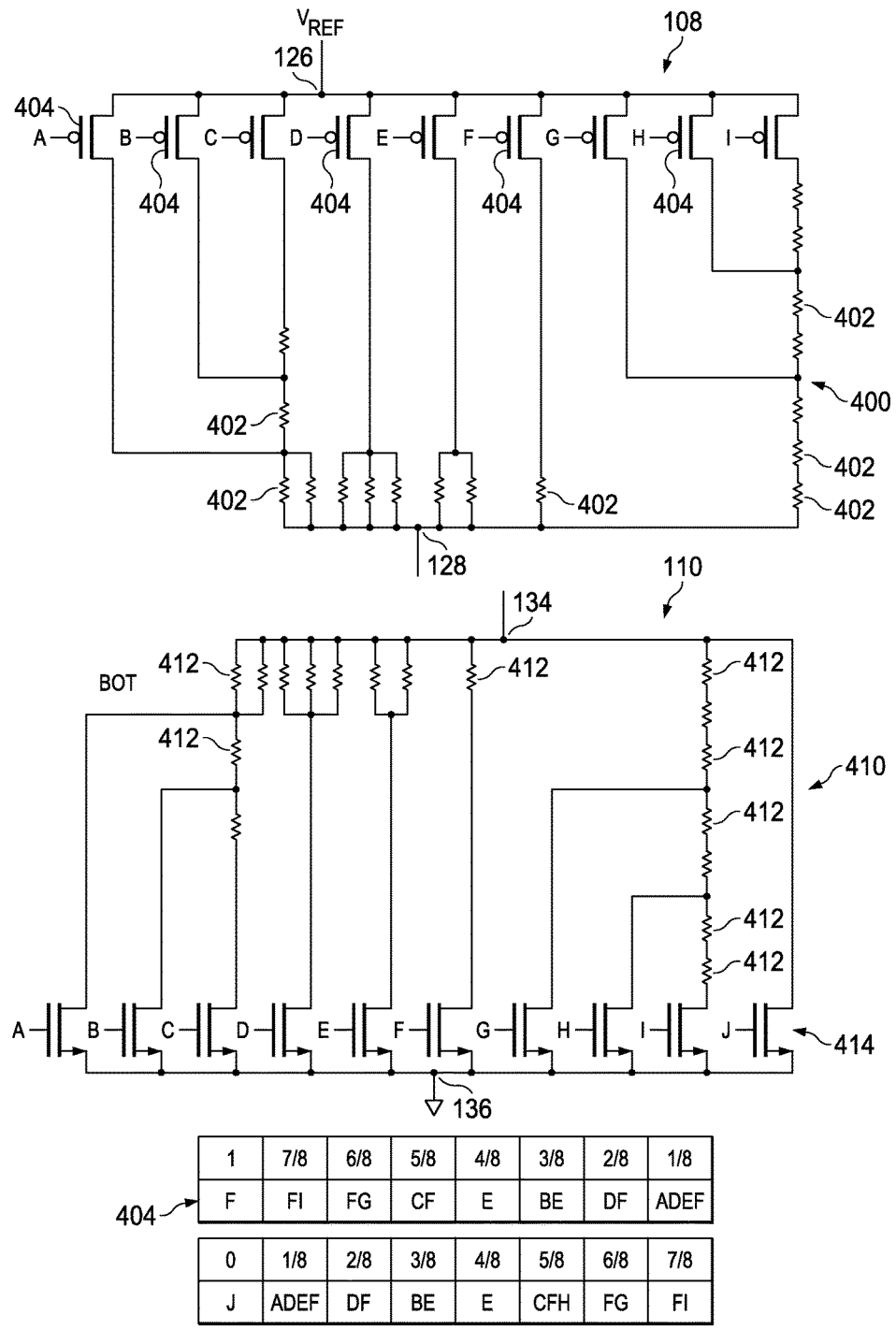
FIG. 4 is a schematic diagram of another embodiment of the second DAC array and the third DAC array of FIG. 1 having three bit resolution.

Another embodiment of the second DAC array 108 and the third DAC array 110 is shown in FIG. 4. The second DAC array 108 has a network 400 of resistors 402 and switches 404. In the embodiment of FIG. 4, there are nine switches referenced as switches A-I. The switches 404 are set according to table 404 to yield the resistance values between the reference input 126 and the reference output 128. Because the second DAC array 108 uses nine switches, nine bits are required to operate the switches 404 to obtain the resistance values that increment in values of (⅛)R. In the embodiment of FIG. 4, all the resistors 402 have the same value, which is referred to as R.

The third DAC array 110 has a network 410 of resistors 412 and switches 414 that is similar to the network 400 of the second DAC array 108. The network 410 is referred to as being the inverse of the network 400 or the mirror image of the network 400. The switches 404 of the second DAC array 108 are connected to or coupled to the reference input 126 wherein the switches 414 of the third DAC array 110 are connected or coupled to the reference output 136. Likewise, the resistors 402 of the second DAC array 108 are connected to or coupled to the reference output 128 and the resistors 412 of the third DAC array 110 are connected to or coupled to the reference input 134. The one exception is the switch J, which is connected between the reference input 134 and the reference output 136.

The DAC arrays 108, 110 of FIGS. 3 and 4 provide for eight resistance values between the reference inputs 126, 134 and the reference outputs 128, 136. The resistance values are in increments of one eighth of the resistance value R. The number of resistance values corresponds to a digital signal generated by the decoder 208, FIG. 2, that has three bits, which corresponds to a value of eight. In other embodiments, a greater number or smaller number of bits are used.

Reference is made to FIG. 5 where embodiments of networks 500 and 502 that provide for a possibility of four different resistance values between the reference inputs 126, 134 and the reference outputs 128, 136 are shown. The four different resistance values correspond to two bits being generated by the decoder 208, FIG. 2. The network 500 has four switches 510 that are connected between the reference input 126 and resistors 512. The resistors 512 are connected to the reference output 128 either directly or by series connections with other resistors. The network 502 uses four switches 520 connected between resistors 522 and the reference output 136. The additional switch 524 in the network 502 shorts the reference input 134 to the reference output 136 when it is closed. The network 500 is referred to as being the mirror image of the network 502.

FIG. 6 shows other embodiments of networks 600 and 602 that provide for a possibility of four different resistance values between the reference inputs 126, 134 and the reference outputs 128, 136. The four different resistance values correspond to two bits being generated by the decoder 208, FIG. 2. The network 600 has four switches 610 that are connected between the reference input 126 and the resistors 612. The resistors 612 are connected to the reference output 128 either directly or by series connections with other resistors. The network 602 uses four switches 620 connected between resistors 622 and the reference output 136. The additional switch 624 in the network 602 shorts the input reference 134 to the output reference 136 when it is closed. The network 600 is sometimes referred to as being the mirror image of the network 602.

Figure 7:
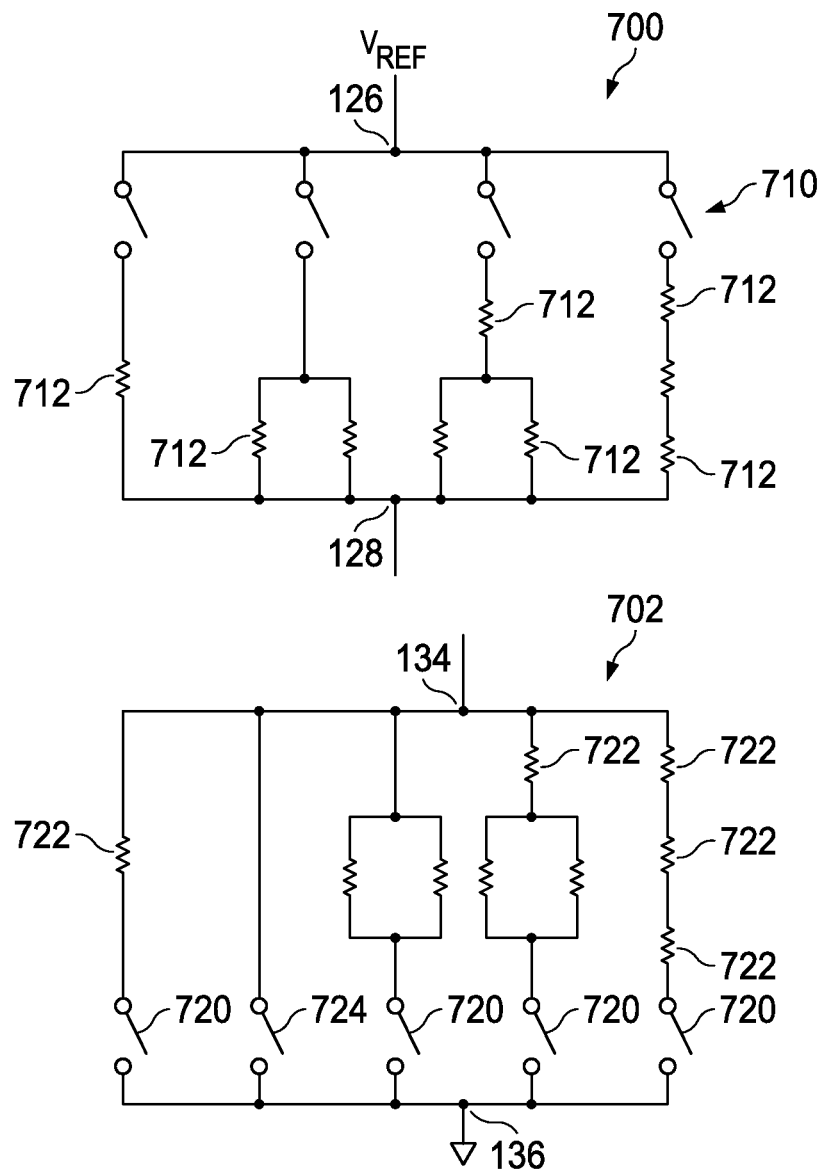
FIG. 7 is a schematic diagram of another embodiment of the second DAC array and the third DAC array of FIG. 1 having two bit resolution.

FIG. 7 shows yet other embodiments of networks 700 and 702 that provide for a possibility of four different resistance values between the reference inputs 126, 134 and the reference outputs 128, 136. As with the networks of FIGS. 5 and 6, the four different resistance values correspond to two bits being generated by the decoder 208, FIG. 2. The network 700 has four switches 710 that are connected between the reference input 126 and the resistors 712. The resistors 712 are connected to the reference output 128 either directly or by series connections with other resistors. The network 702 uses four switches 720 connected between resistors 722 and the reference output 136. The additional switch 724 in the network 602 shorts the reference input 134 to the reference output 136 when it is closed. The network 700 is referred to as being the mirror image of the network 702.

Having described embodiments of the second DAC array 108 and the third DAC array 110, other embodiments will now be described. The embodiments described above use mirror images of the networks in the second DAC arrays 108 and the third DAC arrays 110. In some embodiments, the mirror images are not required. For example, the network 600 may be used in a second DAC array 108 and the network 702 may be used in the third DAC array 110. This embodiment does require the decoder 208, FIG. 2, to output different bits to correspond to the different network patterns.

The networks in the second DAC arrays 108 disclosed above all have a minimum resistance connected between the reference input 126 and the reference output 128. For example the minimum resistance may be R/8 or R/4. This minimum resistance prevents the voltage $V_{REF}$ from being applied directly to the input reference 120 of the first DAC array 106, which reduces the possibility of saturation of the analog signal.

The networks in the third DAC arrays 110 disclosed above all have a switch that enables the reference input 134 to be shorted or directly connected to the reference output 136. In the embodiments where the reference output 136 is ground, this switch effectively provides a ground reference for the reference output 122 of the first DAC array 106.

In many of the networks described above, only approximately one quarter of the resistors are used compared to conventional resistor networks. The result is that the area used by the networks is only one quarter of the size of conventional networks. The reduction in the number of resistors is achieved by the series and parallel connections between the different resistors. It is noted that in all of the networks described above, there is at least one switch connected to resistors connected in parallel wherein the parallel resistors are connected to either the reference output 128 or the reference input 134. In addition, every network has a switch connected to a single resistor that is connected to either the reference output 128 or the reference input 134.

While illustrative and presently preferred embodiments have been described in detail herein, it is to be understood that the inventive concepts may be otherwise variously embodied and employed and that the appended claims are intended to be construed to include such variations except insofar as limited by the prior art.

What is claimed is:
1. A digital to analog converter comprising:
a first digital to analog array having a reference input, a reference output, a first digital input that is connectable to a digital signal, and an analog output; and
a second digital to analog array comprising:
a digital input;
a reference input that is connectable to a first voltage source;
a reference output that is coupled to the reference input of the first digital to analog array;
a plurality of switches that are controlled by signals at the digital input, each switch having a first terminal and a second terminal, the first terminal of each switch coupled to the reference input; and a plurality of resistors connected between the second terminals of the switches and the reference output, wherein a single resistor is connected between one of the second terminal of at least one of the switches and the reference output, and wherein at least two resistors connected in parallel are connected between the second terminal of at least one of the switches and the reference output.

2. The digital to analog converter of claim 1, wherein a third digital to analog array comprises a third digital to analog array comprising:
   a digital input,
   a reference input that is coupled to the reference output of the first digital to analog array;
   a reference output that is connectable to a second voltage source;
   a plurality of switches that are controlled by signals at the digital input, each switch having a first terminal and a second terminal, the first terminal of each switch coupled to the reference input; and
   a plurality of resistors connected between the second terminals of the switches and the reference output, wherein a single resistor is connected between the second terminal of at least one of the switches and the reference output, and wherein at least two resistors are connected in parallel between the second terminal of at least one of the switches and the reference output.

3. The digital to analog converter of claim 1, wherein the resistors all have the same value of resistance.

4. The digital to analog converter of claim 2, wherein:
   the resistors in the second digital to analog array are arranged to form a first network;
   the resistors in the third digital to analog array are arranged to form a second network; and
   the first network is the mirror image of the second network.

5. The digital to analog converter of claim 2 wherein the third digital to analog array comprises a switch connected between the reference input and the reference output and wherein the switch shorts the reference input to the reference output when the switch is closed.

6. The digital to analog converter of claim 1, wherein the second digital array sets a plurality of resistance values between the reference input and the reference output wherein the number of resistance values corresponds to the number of least significant bits of the digital signal.

7. The digital to analog converter of claim 1, wherein the second digital array sets a plurality of resistance values between the reference input and the reference output wherein the number of resistance values corresponds to the number of least significant bits of the digital signal.

8. The digital to analog converter of claim 2, wherein:
   four different resistance values are settable by the second digital to analog array, the difference between resistance values being substantially the same; and
   four different resistance values are settable by the third digital to analog array, the difference between resistance values being substantially the same.

9. The digital to analog converter of claim 8, wherein the second digital to analog array has four switches and wherein the third digital to analog array has five switches.

10. The digital to analog converter of claim 8, wherein three resistors are connected in series between one of the switches of the second digital array and the reference output.

11. The digital to analog converter of claim 2, wherein:
    eight different resistance values are settable by the second digital to analog array, the difference between resistance values being substantially the same; and
    eight different resistance values are settable by the third digital to analog array, the difference between resistance values being substantially the same.

12. The digital to analog converter of claim 11, wherein a single resistor is connected between the reference input and the reference output of the third digital array.

13. The digital to analog converter of claim 11, wherein three resistors are connected in parallel between the reference input and one of the switches of the third digital array.

14. The digital to analog converter of claim 11, wherein four resistors are connected in parallel between the reference input and one of the switches of the third digital array.

15. The digital to analog converter of claim 11, wherein seven resistors are connected in series between the reference input and a first one of the switches of the third digital array.

16. The digital to analog converter of claim 15, wherein a second one of the switches is connected between the junction of two of the seven resistors and the reference output.

17. The digital to analog converter of claim 2, wherein the third digital array has more switches than the second digital array.

18. The digital to analog converter of claim 2, wherein the third digital array has one more switch than the second digital array.

19. A digital to analog converter comprising:
    a first digital to analog array having a reference input, a reference output, a first digital input that is connectable to a digital signal, and an analog output;
    a second digital to analog array comprising:
       a digital input,
       a reference input that is connectable to a first voltage source;
       a reference output that is coupled to the reference input of the first digital to analog array;
       a plurality of switches that are controlled by signals at the digital input, each switch having a first terminal and a second terminal, the first terminal of each switch coupled to the reference input;
       a plurality of resistors connected between the second terminals of the switches and the reference output, wherein a single resistor is connected between one of the second terminal of at least one of the switches and the reference output, wherein at least two resistors connected in parallel are connected between the second terminal of at least one of the switches and the reference output, wherein four resistance values are able to be set between the reference input and the reference output, and wherein the differences between resistance values are substantially equal;
    a third digital to analog array comprising:
       a digital input,
       a reference input that is coupled to the reference output of the first digital to analog array;
       a reference output that is connectable to a second voltage source;
       a plurality of switches that are controlled by signals at the digital input, each switch having a first terminal and a second terminal, the first terminal of each switch coupled to the reference input;
       a plurality of resistors connected between the second terminals of the switches and the reference output, wherein a single resistor is connected between the second terminal of at least one of the switches and the reference output, wherein at least two resistors are connected in parallel between the second terminal of at least one of the switches and the reference output, wherein four resistance values are able to be set between the reference input and the reference output, and wherein the differences between resistance values are substantially equal.

20. A digital to analog converter comprising:
a first digital to analog array having a reference input, a reference output, a first digital input that is connectable to a digital signal, and an analog output;
a second digital to analog array comprising:
  a digital input,
  a reference input that is connectable to a first voltage source;
  a reference output that is coupled to the reference input of the first digital to analog array;
  a plurality of switches that are controlled by signals at the digital input, each switch having a first terminal and a second terminal, the first terminal of each switch coupled to the reference input;
  a plurality of resistors connected between the second terminals of the switches and the reference output, wherein a single resistor is connected between one of the second terminal of at least one of the switches and the reference output, wherein at least two resistors connected in parallel are connected between the second terminal of at least one of the switches and the reference output, wherein eight resistance values are able to be set between the reference input and the reference output, and wherein the differences between resistance values are substantially equal;
a third digital to analog array comprising:
  a digital input,
  a reference input that is coupled to the reference output of the first digital to analog array;
  a reference output that is connectable to a second voltage source;
  a plurality of switches that are controlled by signals at the digital input, each switch having a first terminal and a second terminal, the first terminal of each switch coupled to the reference input;
  a plurality of resistors connected between the second terminals of the switches and the reference output, wherein a single resistor is connected between the second terminal of at least one of the switches and the reference output, wherein at least two resistors are connected in parallel between the second terminal of at least one of the switches and the reference output, wherein eight resistance values are able to be set between the reference input and the reference output, and wherein the differences between resistance values are substantially equal.

* * * * *